United States Patent
Okamoto et al.

(10) Patent No.: US 9,172,369 B2
(45) Date of Patent: Oct. 27, 2015

(54) PROGRAMMABLE LOGIC DEVICE AND SEMICONDUCTOR DEVICE

(71) Applicant: SEMICONDUCTOR ENERGY LABORATORY CO., LTD., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/276,004

(22) Filed: May 13, 2014

(65) Prior Publication Data

US 2014/0340116 A1 Nov. 20, 2014

(30) Foreign Application Priority Data

May 17, 2013 (JP) ................................ 2013-105008

(51) Int. Cl.
*H03K 19/00* (2006.01)
*H03K 19/177* (2006.01)

(52) U.S. Cl.
CPC .......... *H03K 19/0008* (2013.01); *H03K 19/177* (2013.01)

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Jany Richardson
(74) *Attorney, Agent, or Firm* — Fish & Richardson P.C.

(57) ABSTRACT

A programmable logic device having low power consumption with operation speed maintained is provided. The programmable logic device includes a first circuit; a second circuit; a first transistor making electrical connection between the first circuit and the second circuit depending on a potential of a gate of the first transistor; a first switch configured to control supply of a signal to a first node; a second switch configured to control supply of the signal to a second node; a second transistor having a gate and one of a source and a drain that are electrically connected to the first node and having the other of the source and the drain that is electrically connected to the second node; and a capacitor that holds a potential of the signal supplied to the first node.

12 Claims, 11 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,675,382 B2 | 3/2014 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0132931 A1* | 7/2003 | Kimura et al. .............. 345/212 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1* | 10/2006 | Kimura .................... 315/169.3 |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092805 A1 | 4/2010 | Itagaki et al. |
| 2010/0109002 A1 | 5/2010 | Itagaki et al. |
| 2011/0228602 A1* | 9/2011 | Saito et al. .............. 365/185.08 |
| 2013/0207170 A1 | 8/2013 | Kurokawa |
| 2013/0285697 A1 | 10/2013 | Kurokawa |
| 2013/0293263 A1 | 11/2013 | Kurokawa |
| 2013/0314124 A1 | 11/2013 | Ikeda et al. |
| 2013/0321025 A1 | 12/2013 | Kurokawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3—A2O3—BO Systems [A; FE, GA, or AL; B: MG, MN, FE, NI, CU,or ZN] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZNO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTS and Their Application for Large Sized Amoled", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. Amoled Display With Driver Circuit Using Amorphous In—Ga—Zn—Oxide TFTS", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem Oleds", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission Amoled Displayed on Plastic Film and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA Amoled Display Using In—Ga—Zn—Oxide TFTS With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using Castep", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214TH ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA Amoled Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AMOLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6TH International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Eslami.F et al., "Capacitive Boosting for FPGA Interconnection Networks", 21st International Conference on Field Programmable Logic and Applications, 2011, vol. 21, pp. 453-458.

* cited by examiner

FIG. 11A
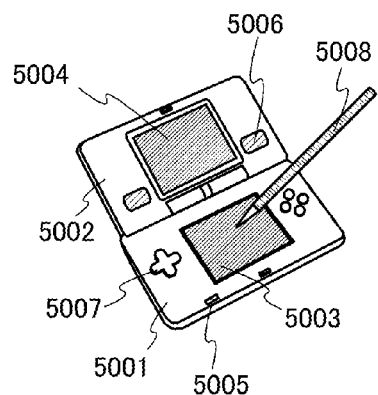
FIG. 11B
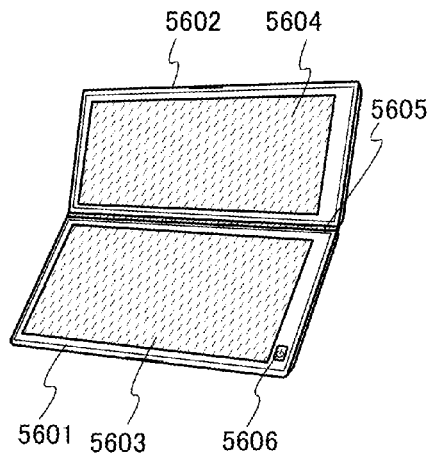
FIG. 11C
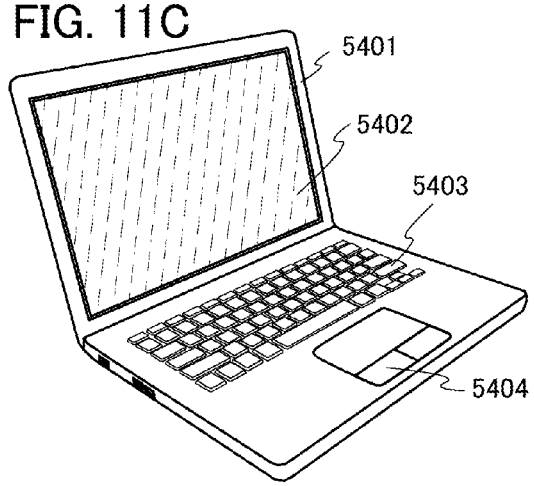
FIG. 11D
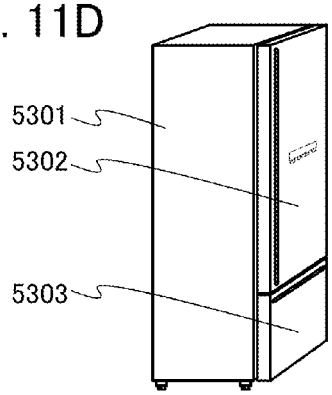
FIG. 11E
FIG. 11F
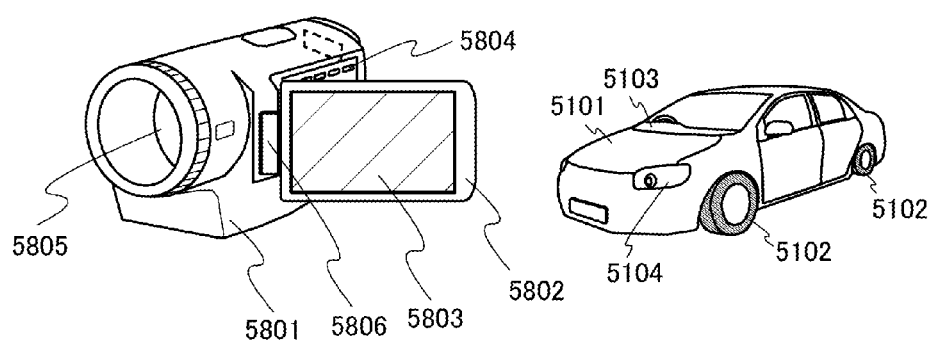

PROGRAMMABLE LOGIC DEVICE AND SEMICONDUCTOR DEVICE

BACKGROUND OF THE INVENTION

1. Field of the Invention

One embodiment of the present invention relates to a semiconductor device. For example, one embodiment of the present invention relates to a programmable logic device in which the configuration of hardware can be changed, and a semiconductor device including the programmable logic device.

2. Description of the Related Art

A programmable logic device (PLD) has a structure in which adequate-scale logic circuits (logic blocks, or programmable logic elements) are electrically connected to each other by a routing resource, and the functions of the logic blocks and the connection between the logic blocks can be changed after manufacture. The functions of the logic blocks and the connection between the logic blocks formed using a routing resource are determined by configuration data, and the configuration data is stored in a register included in each logic block or a register included in the routing resource. A register for storing configuration data is hereinafter referred to as a configuration memory.

Non-Patent Document 1 discloses a field programmable gate array (FPGA) whose routing resource is formed using a circuit in which an SRAM cell is connected to a gate of a pass transistor through an isolator transistor.

REFERENCE

Non-Patent Document

[Non-Patent Document 1] F. Eslami and M. Sima, "Capacitive Boosting for FPGA Interconnection Networks", Int. Conf. on Field Programmable Logic and Applications, 2011, pp. 453-458.

SUMMARY OF THE INVENTION

To evaluate the performance of a semiconductor device such as a programmable logic device, low power consumption and high-speed operation are important factors. However, when power supply voltage is decreased to reduce the power consumption of the semiconductor device, the on-state current of a transistor is decreased, so that the operation speed of the semiconductor device is also decreased. In other words, there is a tradeoff between a reduction in power consumption and an increase in operation speed. In view of the operation speed, it is impossible to simply decrease power supply voltage only for reducing power consumption.

A high-level potential applied to a node in the semiconductor device through an n-channel transistor is decreased by the threshold voltage of the transistor. Thus, when the power supply voltage of the semiconductor device is decreased to reduce power consumption, the potential of the node in the semiconductor device becomes too low, changing the logic level of a signal output from the semiconductor device. Consequently, data reliability is likely to be decreased.

In view of the above technical background, it is an object of one embodiment of the present invention to provide a programmable logic device, a programmable switch, or a semiconductor device having low power consumption with operation speed maintained. It is an object of one embodiment of the present invention to provide a programmable logic device, a programmable switch, or a semiconductor device that can operate normally with low power consumption.

In one embodiment of the present invention, data is written to a semiconductor device by accumulating electric charge in a first node through a first switch. In addition, the above-described data is written to the semiconductor device by accumulating electric charge in a second node through a second switch. The second node is electrically connected to a gate of a first transistor. Electrical connection between the first node and the second node is controlled by a second transistor whose gate is electrically connected to the first node. A capacitor is electrically connected to the first node.

In one embodiment of the present invention, the first switch and the second switch each have an extremely small off-state current. In addition, the second transistor has an extremely small off-state current. With this structure, the first node can become floating, i.e., highly insulated from another electrode or a wiring when the first switch and the second transistor are off. Furthermore, with the above-described structure, the second node can become floating, i.e., highly insulated from another electrode or a wiring when the second switch and the second transistor are off. This enables a potential of a signal including data to be held at the first node and the second node when the first switch, the second switch, and the second transistor are off.

When the potential of the signal is high and the first switch, the second switch, and the second transistor are off, if the potential at the second node decreases over time, electric charge accumulated in the capacitor is supplied to the second node through the second transistor. Therefore, a decrease in the potential at the second node can be prevented.

In one embodiment of the present invention, the semiconductor device further includes the first transistor whose gate is electrically connected to the second node. When a potential of one of the source and a drain of the first transistor is increased from low level to high level, the potential of the gate of the first transistor, i.e., the potential at the second node, is also increased, owing to a floating state of the second node and capacitive coupling of the capacitance C between a source and the gate of the first transistor.

Therefore, in the case where the potential of the signal is high, the potential at the second node is a potential that is smaller than the high-level potential of the signal by the threshold voltage of a transistor included in the second switch; however, the potential at the second node can be increased by the above-described operation. Thus, the gate voltage of the first transistor whose gate is electrically connected to the second node can become much higher than the threshold voltage of the first transistor, and a conduction state of the first transistor can be ensured. Thus, in the semiconductor device of one embodiment of the present invention, a decrease in operation speed of the semiconductor device can be prevented when the power supply voltage supplied to the semiconductor device is decreased.

Specifically, a semiconductor device of one embodiment of the present invention includes a first transistor configured to select a conduction state or non-conduction state depending on a potential of a gate of the first transistor, a first switch configured to control supply of a signal to a first node, a second switch configured to control supply of the signal to a second node; a second transistor having a gate and one of a source and a drain that are electrically connected to the first node and having the other of the source and the drain that is electrically connected to the second node; and a capacitor that holds a potential of the signal supplied to the first node.

Specifically, a programmable logic device of one embodiment of the present invention includes: a first circuit; a second circuit; a first transistor making electrical connection between the first circuit and the second circuit depending on a potential of a gate of the first transistor; a first switch configured to control supply of a signal to a first node; a second switch configured to control supply of the signal to a second node; a second transistor having a gate and one of a source and a drain that are electrically connected to the first node and having the other of the source and the drain that is electrically connected to the second node; and a capacitor that holds a potential of the signal supplied to the first node.

With one embodiment of the present invention, a programmable logic device or a semiconductor device having low power consumption with operation speed maintained can be provided. With one embodiment of the present invention, a programmable logic device or a semiconductor device that can operate normally with low power consumption can be provided.

BRIEF DESCRIPTION OF THE DRAWINGS

In the accompanying drawings:

FIGS. 11A to 11F each illustrate an electronic device.

DETAILED DESCRIPTION OF THE INVENTION

Figure 1A:
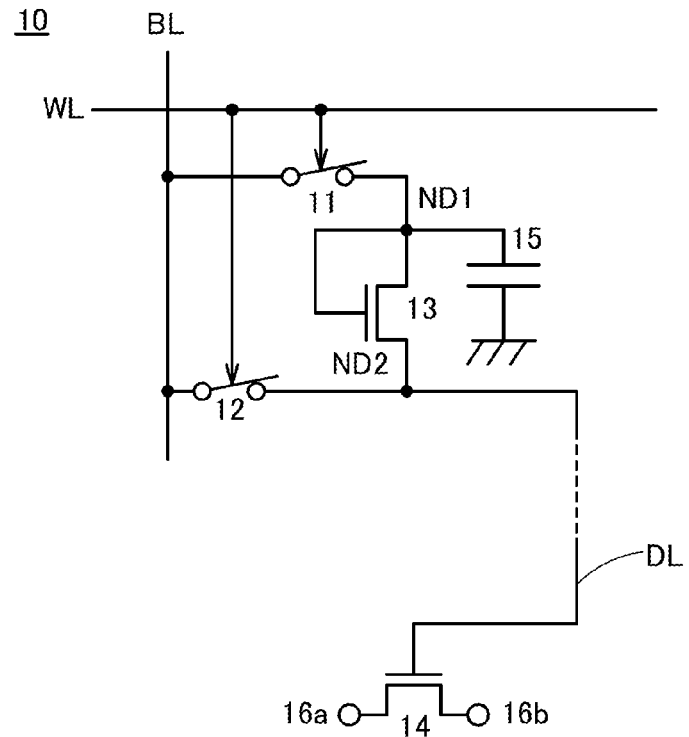
FIGS. 1A and 1B each illustrate a structure of a semiconductor device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that a semiconductor device according to one embodiment of the present invention includes, in its category, a variety of semiconductor integrated circuits formed using semiconductor elements, such as microprocessors, image processing circuits, controllers for semiconductor display devices, digital signal processors (DSP), microcontrollers, control circuits for batteries such as secondary batteries, and protection circuits. A semiconductor device of one embodiment of the present invention includes, in its category, various devices such as RF tags formed using any of the above semiconductor integrated circuits and semiconductor display devices. The semiconductor display device includes, in its category, liquid crystal display devices, light-emitting devices in which a light-emitting element typified by an organic light-emitting element is provided in each pixel, electronic paper, digital micromirror devices (DMD), plasma display panels (PDP), field emission displays (FED), and other semiconductor display devices in which semiconductor elements are included in driver circuits.

Note that the term "connection" in this specification refers to electrical connection and corresponds to the state in which current, voltage, or a potential can be supplied or transmitted. Accordingly, a connection state means not only a state of direct connection but also a state of electrical connection through a circuit element such as a wiring, a resistor, a diode, or a transistor so that current, voltage, or a potential can be supplied or transmitted.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the conductivity type of the transistor or levels of potentials applied to terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

<Structure Example 1 of Semiconductor Device>

First, a structure example of a semiconductor device of one embodiment of the present invention will be described. FIG. 1A illustrates a structure of a semiconductor device 10 of one embodiment of the present invention.

The semiconductor device 10 of one embodiment of the present invention includes a first switch 11, a second switch 12, a transistor 13, a transistor 14, and a capacitor 15. The first switch 11 has a function of controlling the supply of a signal including data from a wiring BL to a node ND1. Although the on/off state of the first switch 11 and the second switch 12 is determined by the potential of a signal supplied to a wiring WL in FIG. 1A, signals may be supplied separately from different wirings to the first switch 11 and the second switch 12 to determine the on/off state thereof.

When a potential of the signal is supplied to the node ND1 through the first switch 11, electric charge corresponding to the potential is accumulated in the node ND1 and data is written to the node ND1. The second switch 12 has a function of controlling the supply of a signal including data from a wiring BL to the node ND2. When the potential of the signal is supplied to the node ND2 through the second switch 12, electric charge corresponding to the potential is accumulated in the node ND2 and data is written to the node ND2.

A gate and one of a source and a drain of the transistor 13 are electrically connected to the node ND1. The other of the source and the drain of the transistor 13 is electrically connected to the node ND2. The capacitor 15 has a function of holding the potential of the signal supplied to the node ND1 through the first switch 11. Specifically, the capacitor 15 includes a pair of electrodes; one of them is electrically connected to the node ND1.

The node ND2 is connected to a wiring DL. The on/off state of the transistor 14 is determined by the potential at the node ND2. Specifically, the wiring DL is connected to a gate of the transistor 14. When the transistor 14 is on, a terminal 16a connected to one of a source and a drain of the transistor 14 is electrically connected to a terminal 16b connected to the other of the source and the drain of the transistor 14. Furthermore, when the transistor 14 is off, the terminal 16a connected to one of the source and the drain of the transistor 14 is electrically disconnected from the terminal 16b connected to the other of the source and the drain of the transistor 14.

In one embodiment of the present invention, the first switch 11 and the second switch 12 each have an extremely small off-state current. Specifically, a transistor included in the first switch 11 and a transistor included in the second switch 12 each have an extremely small off-state current. In addition, the transistor 13 in one embodiment of the present invention has an extremely small off-state current.

A transistor including a channel formation region in a film of a semiconductor having a wider band gap and lower intrinsic carrier density than silicon can have significantly lower off-state current than a transistor formed using a normal semiconductor such as silicon or germanium. Thus, such a transistor is suitable for the first switch 11, the second switch 12, and the transistor 13. Examples of such a semiconductor are an oxide semiconductor and gallium nitride that each have a band gap more than twice as wide as that of silicon.

With the above-described structure, the node ND1 can become floating, i.e., highly insulated from another electrode or a wiring when the first switch 11 and the transistor 13 are off. Furthermore, with the above-described structure, the second node ND2 can become floating, i.e., highly insulated from another electrode or a wiring when the second switch 12 and the transistor 13 are off. This enables the potential of the signal including data to be held at the node ND1 and the node ND2 when the first switch 11, the second switch 12, and the transistor 13 are off.

Note that off-state current in this specification refers to current flowing in a cut-off region between a source and a drain of a transistor, unless otherwise specified.

Figure 1B:
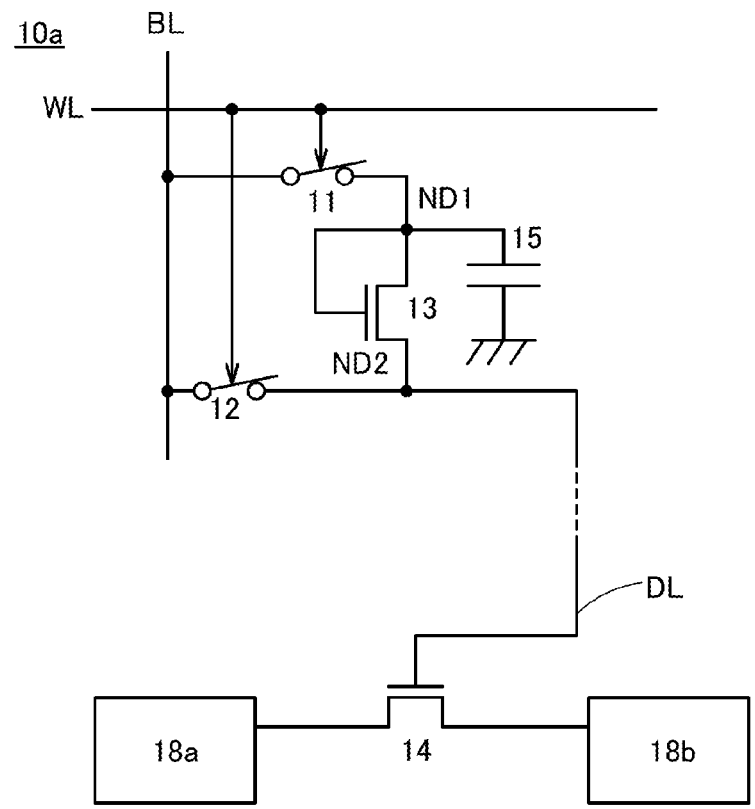

Next, a structure example of a PLD of one embodiment of the present invention will be described. FIG. 1B illustrates a structure of a PLD 10a of one embodiment of the present invention, as an example.

A PLD 10a illustrated in FIG. 1B is different from the semiconductor device 10 illustrated in FIG. 1A in that the terminal 16a is connected to an output terminal of a logic block 18a and the terminal 16b is connected to an input terminal of a logic block 18b. FIG. 1B illustrates a case in which electrical connection between the logic block 18a and the logic block 18b is determined by the potential at the node ND2, that is, the potential of the wiring DL in the PLD 10a.

In the case where the data supplied from the wiring BL to the PLD 10a is configuration data, electrical connection between the logic block 18a and the logic block 18b can be controlled in accordance with the configuration data held at the node ND2.

<Specific Structure Example of Semiconductor Device>

Figure 2:
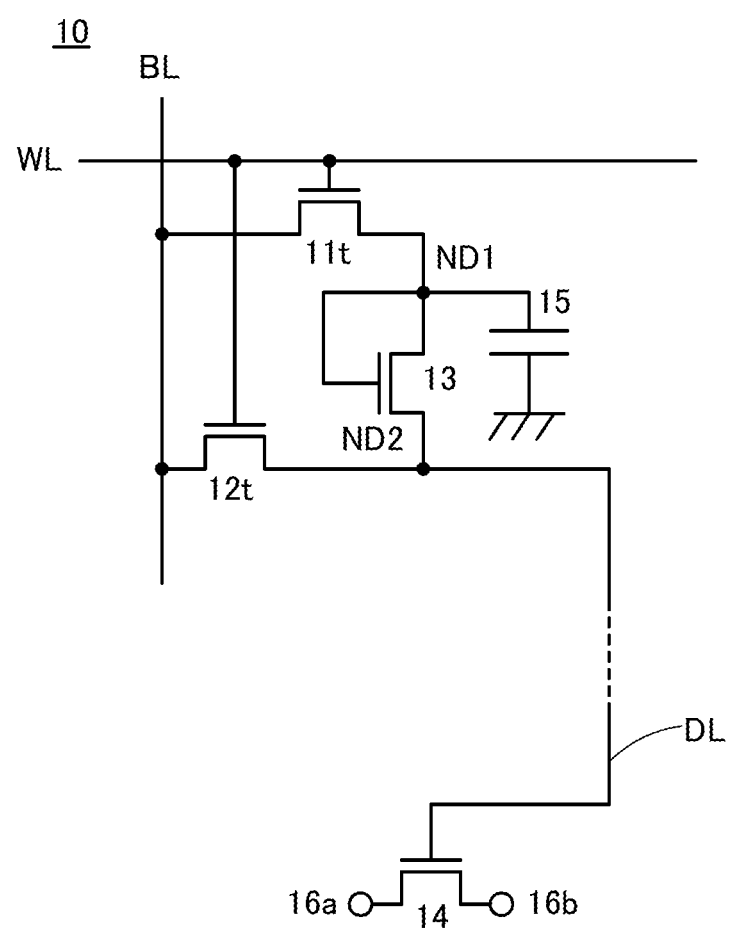
FIG. 2 illustrates a structure of a semiconductor device.

Next, a more specific structure example of the semiconductor device 10 illustrated in FIG. 1A will be described. FIG. 2 illustrates a structure of the semiconductor device 10 of one embodiment of the present invention, as an example.

The semiconductor device 10 illustrated in FIG. 2 includes a transistor 11t functioning as the first switch 11, a transistor 12t functioning as the second switch 12, the transistor 13, the transistor 14, and the capacitor 15.

A gate of the transistor 11t is connected to the wiring WL. One of a source and a drain of the transistor 11t is connected to the wiring BL, and the other of the source and the drain of the transistor 11t is connected to the node ND1. A gate of the transistor 12t is connected to the wiring WL. One of a source and a drain of the transistor 12t is connected to the wiring BL, and the other of the source and the drain of the transistor 12t is connected to the node ND2. A gate and one of a source and a drain of the transistor 13 are connected to the node ND1. The other of the source and the drain of the transistor 13 is connected to the node ND2. The node ND2 is connected to the wiring DL, and the wiring DL is connected to the gate of the transistor 14. One of the source and the drain of the transistor 14 is connected to the terminal 16a, and the other of the source and the drain of the transistor 14 is connected to the terminal 16b.

<Operation Example of Semiconductor Device>

Figure 3:
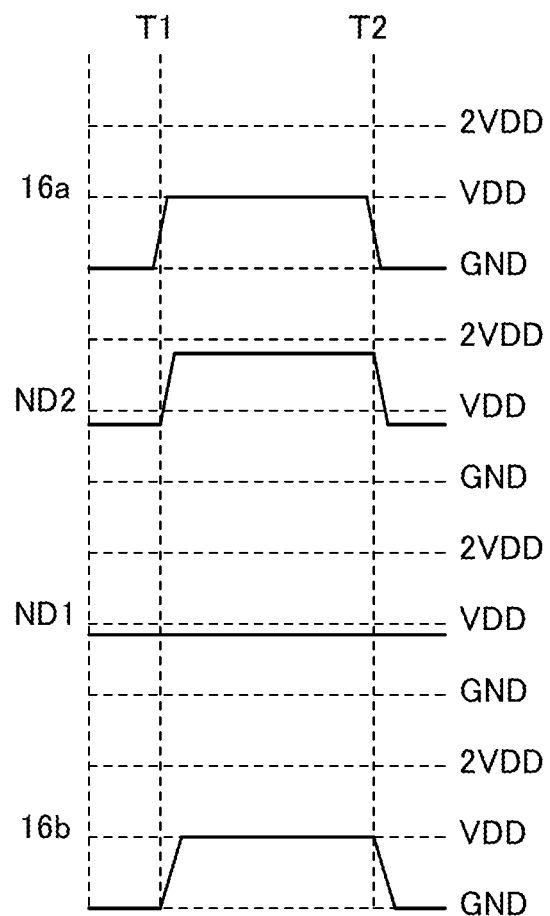
FIG. 3 is a timing chart.

Next, an operation example of the semiconductor device 10 illustrated in FIG. 2 will be described using a timing chart of FIG. 3. In the following description, an operation example of the semiconductor device 10 in the case where the transistor 11t, the transistor 12t, the transistor 13, and the transistor 14 are all n-channel transistors will be described.

First, a high-level potential VDD is applied to the wiring WL to turn on the transistor 11t and transistor 12t. Then, a high-level potential VDD corresponding to a logical level "1" supplied to the wiring BL is supplied to the node ND1 and the node ND2 through the transistor 11t and the transistor 12t, respectively. Specifically, the potential at the node ND1 is equal to the potential obtained by subtracting the threshold voltage of the transistor 11t from the potential VDD. In addition, the potential at the node ND2 is equal to the potential obtained by subtracting the threshold voltage of the transistor 12t from the potential VDD (the potential VDD−Vth).

Note that in the case where a low-level potential (e.g., a ground potential GND) corresponding to a logical level "0" is supplied to the wiring BL when the transistor 11t and the transistor 12t are on, the ground potential GND is supplied to the node ND1 and the node ND2. In the following description, an operation example of the semiconductor device 10 in the case where a potential VDD corresponding to a logical level "1" is supplied from the wiring BL to the node ND1 and the node ND2 will be described.

Next, a low-level potential is supplied to the wiring WL to turn off the transistor 11t and the transistor 12t. At this time, data corresponding to the logical level "1" is held at the node ND1 and the node ND2. Because the transistor 13 is off, the node ND1 and the node ND2 become floating. Thus, like the node ND2, the potential VDD−Vth, which is the potential obtained by subtracting the threshold voltage of the transistor 12t from the potential VDD, is held at the wiring DL.

Next, at Time T1, the potential of the terminal 16a is increased from the ground potential GND to the potential VDD. Because of capacitive coupling of the capacitance C between the source and the gate of the transistor 14, an increase in the potential of the terminal 16a increases the potential of the gate of the transistor 14, that is, the potentials of the wiring DL and the node ND2. In an ideal state in which a parasitic capacitance of the node ND2 is significantly lower than the capacitance C between the source and the gate of the transistor 14, the potentials of the wiring DL and the node ND2 are increased to a sum (2VDD−Vth) of the potential obtained by subtracting the threshold voltage of the transistor 12t from the potential VDD (the potential VDD−Vth) and a voltage equivalent to the difference between the ground potential GND and the potential VDD. Accordingly, the gate voltage of the transistor 14 can become much higher than the threshold voltage of the transistor 14, and thus on state of the transistor 14 can be ensured. Accordingly, the potential of the terminal 16a is supplied to the terminal 16b.

In the semiconductor device 10 of one embodiment of the present invention, when the power supply voltage supplied to the semiconductor device 10 is decreased and a potential difference between the potential VDD and the ground potential GND becomes small, a decrease in the on-state current of the transistor 14 can be prevented; accordingly, a decrease in operation speed of the semiconductor device 10 can be prevented.

The increase in the potential of the node ND2 depends on the capacitance ratio between the parasitic capacitance of the node ND2 and the capacitance C between the source and the gate of the transistor 14. Specifically, as the parasitic capacitance of the node ND2 is lower with respect to the capacitance C, the increase in the potential at the node ND2 is larger. Conversely, as the parasitic capacitance of the node ND2 is higher with respect to the capacitance C, the increase in the potential at the node ND2 is smaller. Accordingly, a higher parasitic capacitance of the node ND2 can increase the on-state current of the transistor 14 more, thereby increasing the operation speed of the semiconductor device 10.

Furthermore, a longer data holding period of the semiconductor device 10 can be achieved as the potential corresponding to data can be held at the node ND2 longer. For a longer data holding period, it is preferable to connect a capacitor having as a high capacitance as possible to the node ND2. However, to cause a large increase in the potential of the gate due to capacitive coupling of the capacitance C of the transistor 14, a capacitor having a high capacitance connected to the node ND2 as well as the parasitic capacitance at the node ND2 is not preferable. In other words, there is a trade-off between the increase in the potential of the gate due to capacitive coupling of the capacitance C of the transistor 14 and the length of data holding period of the semiconductor device 10.

In the semiconductor device 10 of one embodiment of the present invention, the capacitor 15 is connected to the node ND1, and in addition, connection between the node ND1 and the node ND2 is controlled by the transistor 13 whose gate is connected to the node ND1. When the transistor 13 is off, the node ND2 is electrically disconnected from the capacitor 15, and the capacitance of the capacitor 15 does not contribute the increase in the potential of the gate of the transistor 14 due to capacitive coupling of the capacitance C of the transistor 14. When, after the elapse of a certain period of time, the potential at the node ND2 is about to become lower than the potential at the node ND1 owing to the off-state current of the transistor 12t, the leakage current flowing between the gate and the source or drain of the transistor 14, or the like, a potential is supplied from the node ND1 to the node ND2 through the transistor 13. That is, the capacitor 15 contributes holding of the potential at the node ND2. In summary, one embodiment of the present invention can have a large increase in the potential of the gate of the transistor 14 due to capacitive coupling of the capacitance C and a long data holding period of the semiconductor device 10.

Note that since the capacitance of the capacitor 15 connected to the node ND1 is higher than the parasitic capacitance of the node ND2, it is preferable that the channel width of the transistor 11t configured to control the supply of the potential to the node ND1 be larger than each channel width of the transistor 12t configured to control the supply of the potential to the node ND2 and the transistor 13.

At Time T2 when the potential of the terminal 16a is changed from the potential VDD to the ground potential GND, the potential at the node ND2 is decreased to the potential (VDD−Vth) obtained by subtracting the threshold voltage of the transistor 12t from the potential VDD, owing to capacitive coupling of the capacitance C of the transistor 14.

<Structure Example 2 of Semiconductor Device>

Figure 4A:
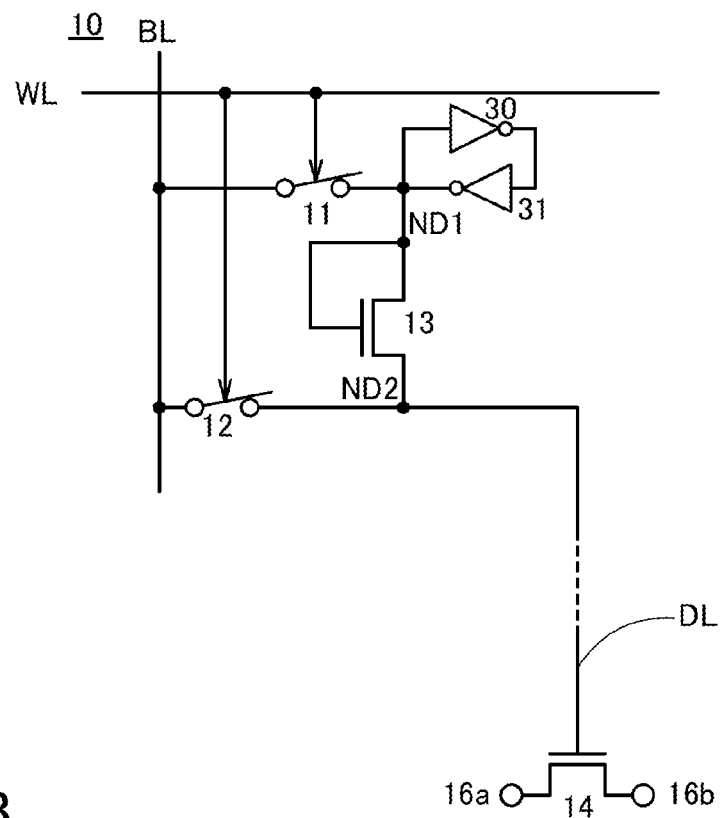
FIGS. 4A and 4B each illustrate a structure of a semiconductor device.

Next, another structure example of the semiconductor device 10 illustrated in FIG. 1A will be described. FIG. 4A illustrates an example of the semiconductor device 10. Like the semiconductor device 10 illustrated in FIG. 1A, the semiconductor device 10 illustrated in FIG. 4A includes the switch 11, the switch 12, the transistor 13, and the transistor 14. The semiconductor device 10 illustrated in FIG. 4A is different in structure from the semiconductor device 10 illustrated in FIG. 1A in that an inverter 30 and an inverter 31 for holding the potential at the node ND1 are provided instead of the capacitor 15.

Specifically, in FIG. 4A, an input terminal of the inverter 30 and an output terminal of the inverter 31 are electrically connected to the node ND1, and an output terminal of the inverter 30 and an input terminal of the inverter 31 are electrically connected to each other. With this structure, the potential at the node ND1 can be held by the inverters 30 and 31 in the semiconductor device 10 illustrated in FIG. 4A.

Figure 4B:
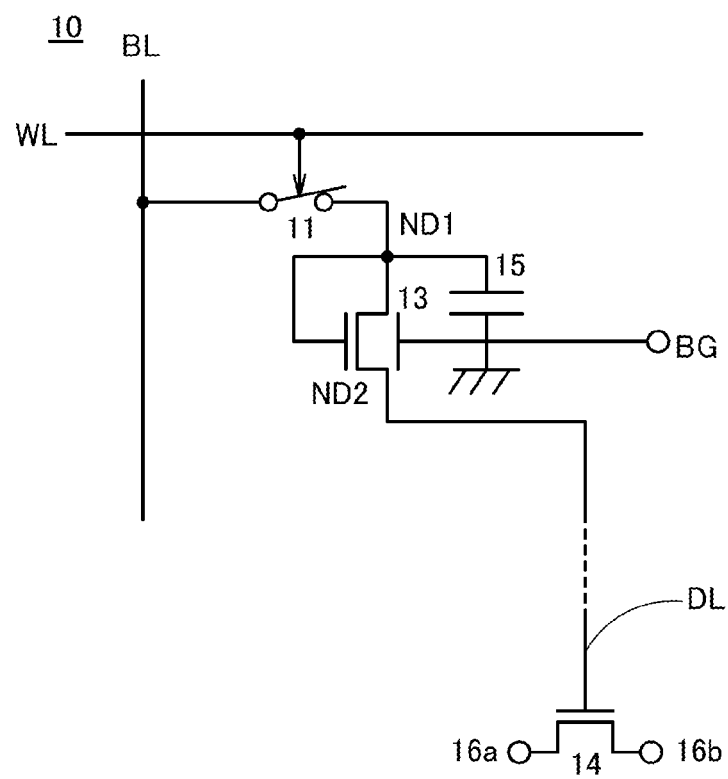

Next, another structure example of the semiconductor device 10 illustrated in FIG. 1A will be described. FIG. 4B illustrates an example of the semiconductor device 10. Like the semiconductor device 10 illustrated in FIG. 1A, the semiconductor device 10 illustrated in FIG. 4B includes the switch 11, the transistor 13, the transistor 14, and the capacitor 15. The semiconductor device 10 illustrated in FIG. 4B is different in structure from the semiconductor device 10 illustrated in FIG. 1A in that the switch 12 is not included and the transistor 13 includes a pair of gates that overlap each other with a semiconductor film sandwiched therebetween.

Specifically, in FIG. 4B, one gate (front gate) of the transistor 13 is connected to the node ND1, and the other gate of the transistor 13 is connected to the wiring BG. When a potential of a signal including data is supplied to the node ND1 and the node ND2, a potential higher than each potential of the source and the drain of the transistor 13 is supplied to the wiring BG to negatively shift the threshold voltage of the transistor 13. With this structure, in the case where a high-level potential is held at the node ND2, a low-level potential can be supplied to the node ND2 through the transistor 13 without the switch 12.

The semiconductor devices 10 illustrated in FIGS. 4A and 4B may further include another circuit element such as a transistor, a diode, a resistor, a capacitor, or an inductor as needed.

<Structure Example 3 of Semiconductor Device>

Next, a structure example of a semiconductor device 10b that includes a combination of a plurality of the semiconductor devices 10 illustrated in FIG. 2 and controls electrical connection between the terminals 16a and 16b will be described.

Figure 5:
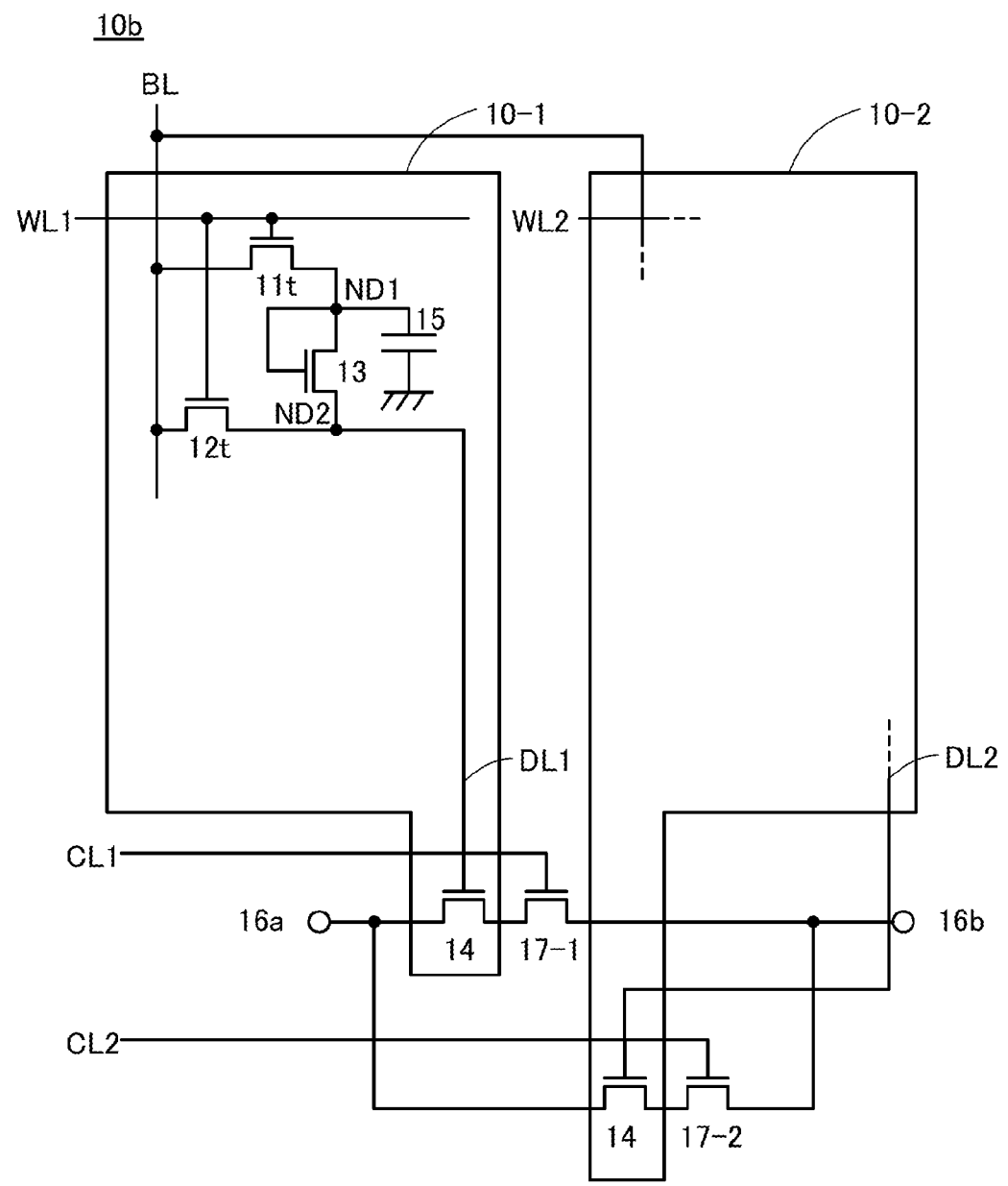
FIG. 5 illustrates a semiconductor device.

FIG. 5 illustrates an example of the semiconductor device 10b. The semiconductor device 10b includes a plurality of the semiconductor devices 10 illustrated in FIG. 2. FIG. 5 illustrates an example in which the semiconductor device 10b includes two semiconductor devices (a semiconductor device 10-1 and a semiconductor device 10-2).

In the semiconductor device 10b, a transistor 17-1 for controlling electrical connection between the terminals 16a and 16b is serially connected to the transistor 14 included in the semiconductor device 10-1. In addition, in the semiconductor device 10b, a transistor 17-2 for controlling electrical connection between the terminals 16a and 16b is serially connected to the transistor 14 included in the semiconductor device 10-2. A wiring CL1 is connected to a gate of the transistor 17-1, and a wiring CL2 is connected to a gate of the transistor 17-2.

In each of the semiconductor devices 10-1 and 10-2, the potential of the signal including data held at the node ND2 and the wiring DL determines the on/off state of the transistor 14. When one of the wirings CL1 and CL2 is selected to have a high-level potential, connection between the terminals 16a and 16b is controlled in accordance with the potential of the signal including data held in either the semiconductor device 10-1 or the semiconductor device 10-2.

Specifically, in the case where a high-level potential is supplied to the wiring CL1 and a low-level potential is supplied to the wiring CL2, the transistor 17-1 is turned on and the transistor 17-2 is turned off. In accordance with the potential of the signal including data held in the semiconductor device 10-1, connection between the terminals 16a and 16b through the transistor 14 in the semiconductor device 10-1 is controlled. In the case where a low-level potential is supplied to the wiring CL1 and a high-level potential is supplied to the wiring CL2, the transistor 17-2 is turned on and the transistor 17-1 is turned off. In accordance with the potential of the signal including data held in the semiconductor device 10-2, connection between the terminals 16a and 16b through the transistor 14 included in the semiconductor device 10-2 is controlled.

<Specific Structure Example of PLD>

Figure 6:
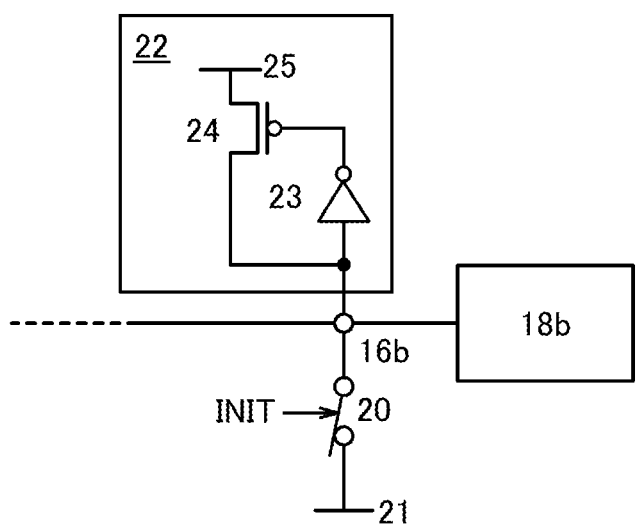
FIG. 6 illustrates a structure including a switch for initialization and a latch.

In a PLD of one embodiment of the present invention, a switch for initializing the potential of the terminal 16b or a latch for holding the potential of the terminal 16b may be electrically connected to the terminal 16b. FIG. 6 illustrates an example in which a switch 20 for initializing the potential of the terminal 16b and a latch 22 for holding the potential of the terminal 16b are electrically connected to the terminal 16b.

The switch 20 has a function of controlling electrical connection between the terminal 16b and a wiring 21 to which a potential for initialization is supplied. In one embodiment of the present invention, the switch 20 is electrically connected to the terminal 16b, so that the potential of the terminal 16b can be kept low after the PLD is powered on. Accordingly, application of an intermediate potential to the terminal 16b can be prevented, thus, generation of flow-through current in a logic block 18b having an input terminal connected to the terminal 16b can be prevented.

The latch 22 illustrated in FIG. 6 has a function of keeping the potential of the terminal 16b either high or low. Specifically, the latch 22 includes an inverter 23 and a p-channel transistor 24. An input terminal of the inverter 23 is electrically connected to the terminal 16b, and an output terminal of the inverter 23 is electrically connected to a gate of the transistor 24. One of a source and a drain of the transistor 24 is electrically connected to a wiring 25 to which a potential higher than the potential of the wiring 21 is supplied, and the other is electrically connected to the terminal 16b.

In one embodiment of the present invention, the latch 22 with the above structure is electrically connected to the terminal 16b, so that the potential of the terminal 16b can be kept either high or low after the PLD is powered on. Accordingly, application of an intermediate potential to the terminal 16b can be prevented; thus, generation of flow-through current in the logic block 18b having an input terminal connected to the terminal 16b can be prevented.

Figure 7A:
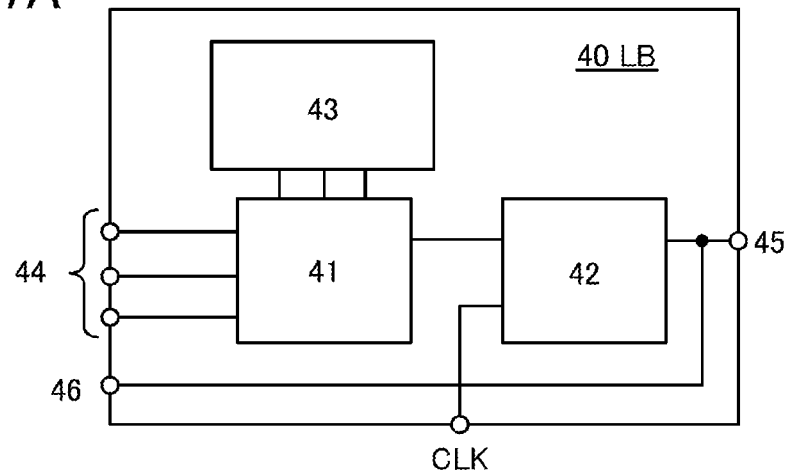
FIGS. 7A to 7C each illustrate a structure of a logic block.

FIG. 7A illustrates one mode of a logic block (LB) 40. The logic block 40 illustrated in FIG. 7A includes a look-up table (LUT) 41, a flip-flop 42, and a storage device 43. Logical operation of the LUT 41 is determined in accordance with configuration data in the storage device 43. Specifically, one output value of the LUT 41 with respect to input values of a plurality of input signals supplied to input terminals 44 is determined. Then, the LUT 41 outputs a signal including the output value. The flip-flop 42 holds the signal output from the LUT 41 and outputs an output signal corresponding to the signal from a first output terminal 45 and a second output terminal 46 in synchronization with a clock signal CLK.

Note that the logic block 40 may further include a multiplexer circuit. The multiplexer circuit can select whether the output signal from the LUT 41 goes through the flip-flop 42.

The type of the flip-flop 42 may be determined by configuration data. Specifically, the flip-flop 42 may have a function of any of a D flip-flop, a T flip-flop, a JK flip-flop, and an RS flip-flop, depending on the configuration data.

Figure 7B:
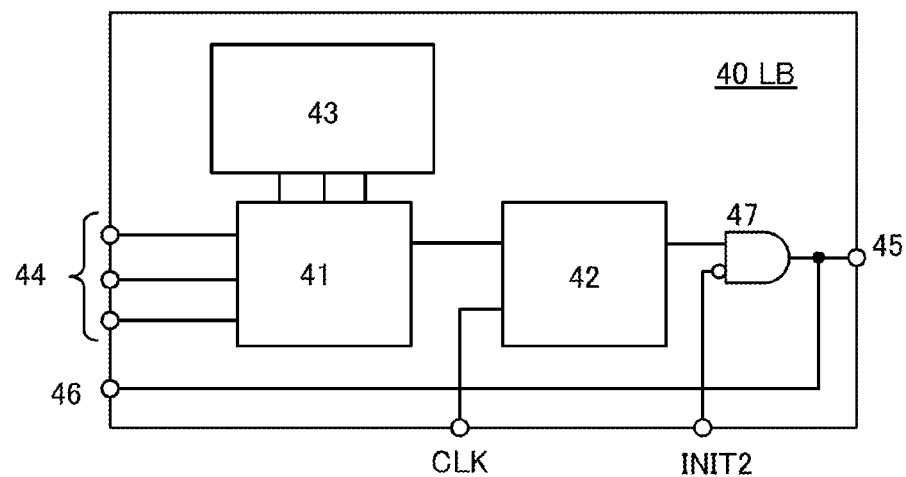

FIG. 7B illustrates another mode of the logic block 40. The logic block 40 in FIG. 7B has a structure in which an AND circuit 47 is added to the logic block 40 in FIG. 7A. To the AND circuit 47, a signal from the flip-flop 42 is supplied as a positive logic input, and the signal INIT2 for initializing the potential of the wiring DL is supplied as a negative logic input. With such a structure, the potential of a wiring to which a signal output from the logic block 40 is supplied can be initialized. Consequently, flow of a large amount of current between the logic blocks 40 can be prevented, so that breakage of the PLD can be prevented.

Figure 7C:
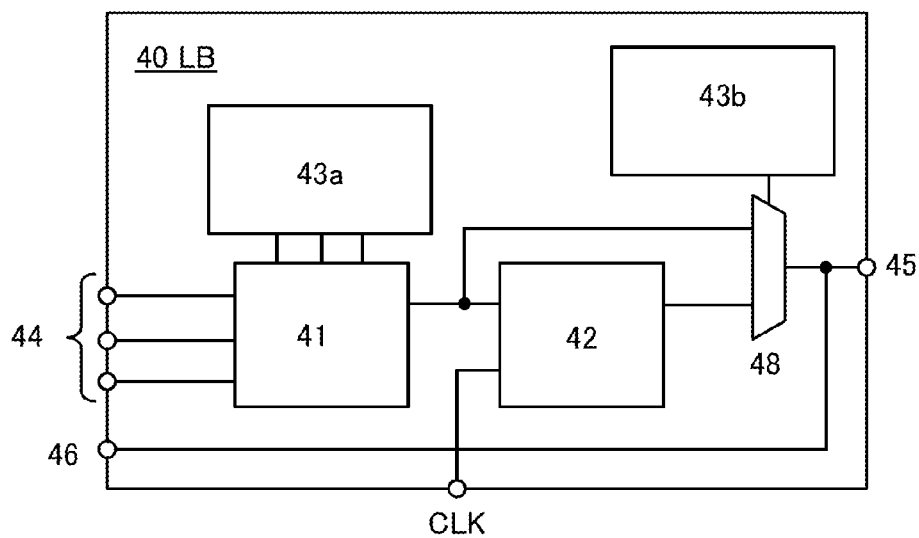

FIG. 7C illustrates another mode of the logic block 40. The logic block 40 in FIG. 7C has a structure in which a multiplexer 48 is added to the logic block 40 in FIG. 7A. The logic block 40 in FIG. 7C includes two storage devices 43 (storage devices 43a and 43b). Logical operation of the LUT 41 is determined in accordance with configuration data in the storage device 43a. A signal output from the LUT 41 and a signal output from the flip-flop 42 are input to the multiplexer 48. The multiplexer 48 has functions of selecting and outputting one of the two output signals in accordance with configuration data stored in the storage device 43b. The signal output from the multiplexer 48 is output from the first output terminal 45 and the second output terminal 46.

Figure 8A:
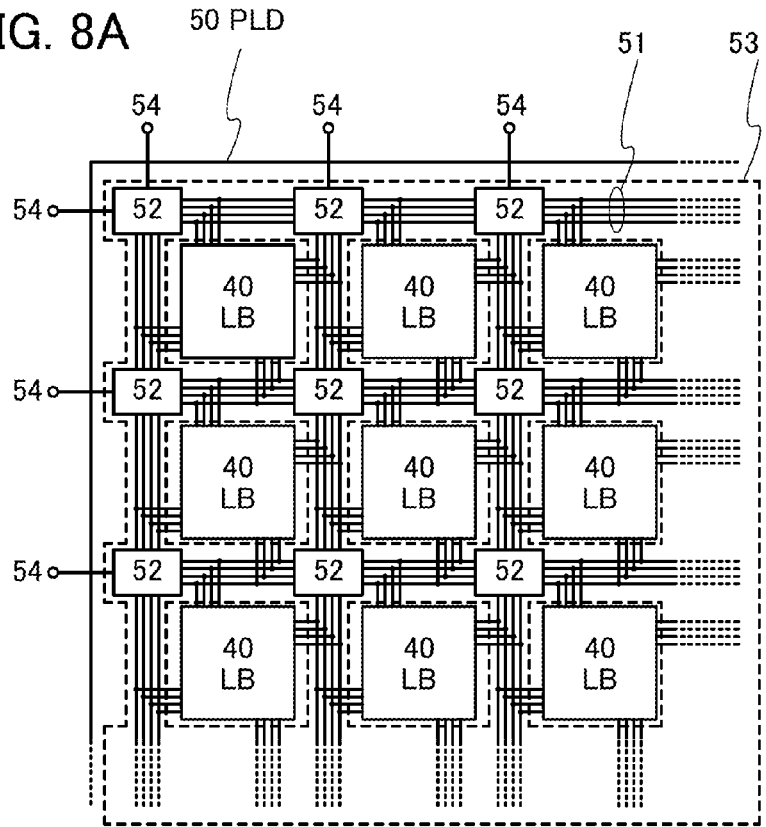
FIGS. 8A and 8B illustrate a structure of a PLD.

FIG. 8A schematically illustrates part of the structure of a PLD 50. The PLD 50 in FIG. 8A includes a plurality of logic blocks (LB) 40, a wiring group 51 connected to any of the plurality of logic blocks 40, and switch circuits 52 for controlling the connection between the wirings of the wiring group 51. The wiring group 51 and the switch circuits 52 constitute a routing resource 53.

Figure 8B:
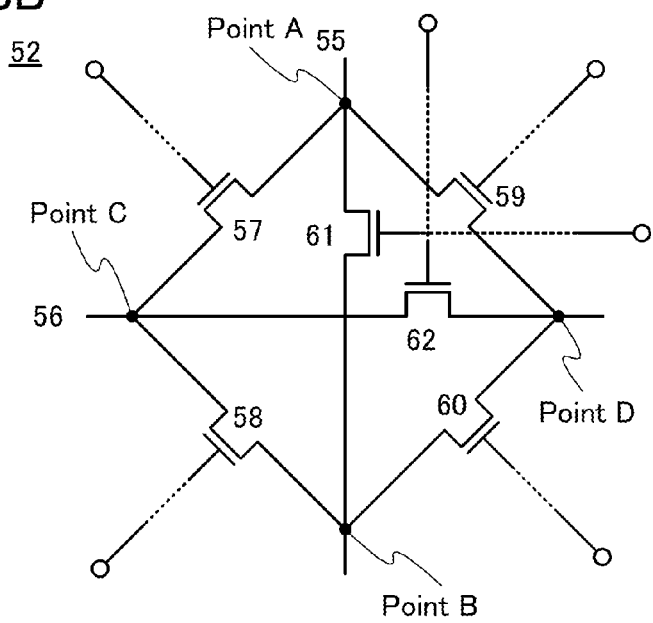

FIG. 8B illustrates a structure example of the switch circuit 52. The switch circuit 52 in FIG. 8B has a function of controlling connection between a wiring 55 and a wiring 56 included in the wiring group 51. Specifically, the switch circuit 52 includes transistors 57 to 62. The transistors 57 to 62 each correspond to the transistor 14 included in the semiconductor device 10. Although not illustrated, gates of the transistors 57 to 62 are connected to the wirings DL and the nodes ND2 of the plurality of semiconductor devices 10. Selection (switching) of the on/off state of each of the transistors 57 to 62 is determined by data held at the node ND2 and the wiring DL of the semiconductor device 10.

The transistor 57 has a function of controlling electrical connection between a point A of the wiring 55 and a point C of the wiring 56. The transistor 58 has a function of controlling electrical connection between a point B of the wiring 55 and the point C of the wiring 56. The transistor 59 has a function of controlling electrical connection between the point A of the wiring 55 and a point D of the wiring 56. The transistor 60 has a function of controlling electrical connection between the point B of the wiring 55 and the point D of the wiring 56. The transistor 61 has a function of controlling electrical connection between the point A and the point B of the wiring 55. The transistor 62 has a function of controlling electrical connection between the point C and the point D of the wiring 56.

The switch circuits 52 also have a function of controlling electrical connection between the wiring group 51 and terminals 54 of the PLD 50.

Figure 9:
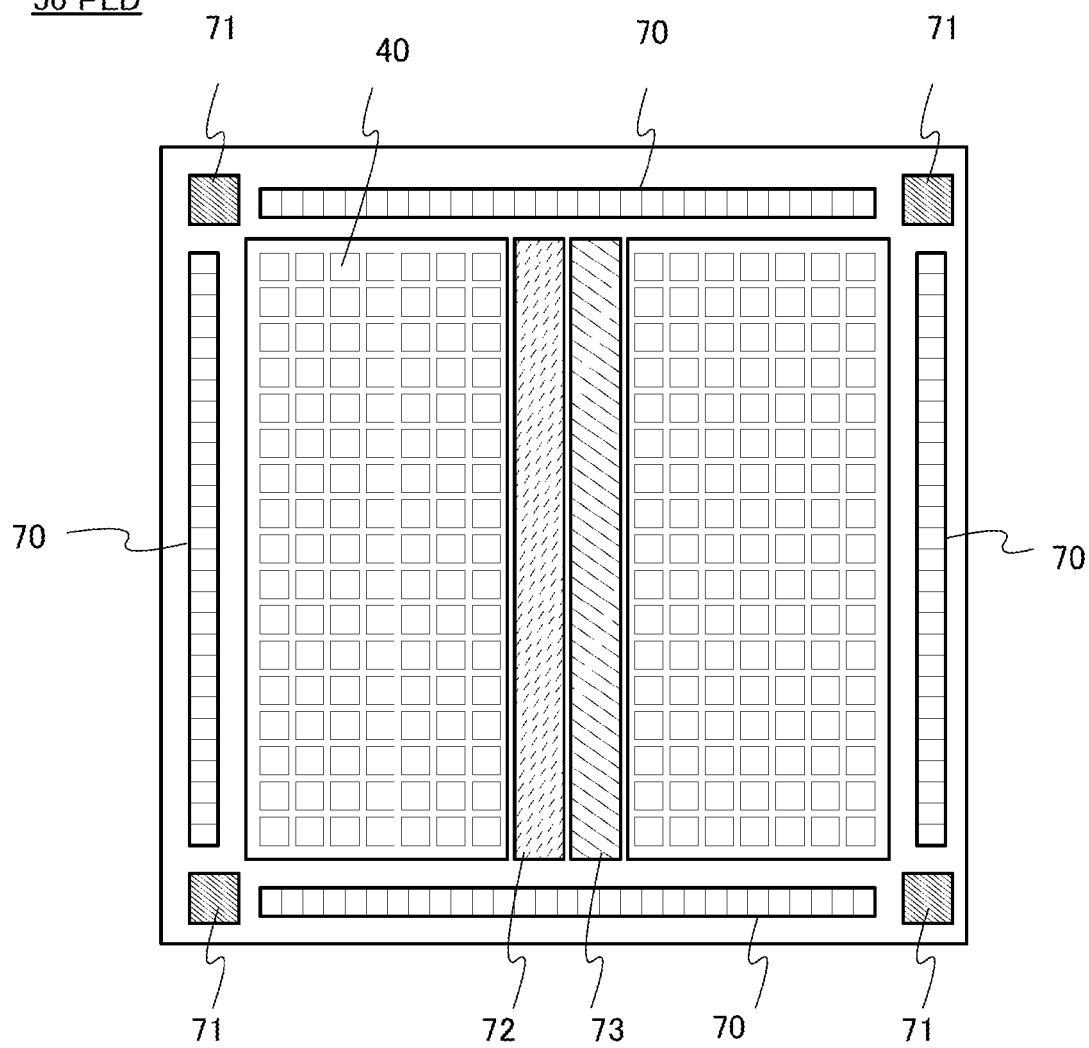
FIG. 9 illustrates a structure of a PLD.

FIG. 9 illustrates an example of the entire structure of the PLD 50. In FIG. 9, I/O elements 70, phase lock loops (PLL) 71, a RAM 72, and a multiplier 73 are provided in the PLD 50. The I/O elements 70 function as interfaces that control input and output of signals from and to an external circuit of the PLD 50. The PLL 71 has a function of generating a clock signal CLK. The RAM 72 has a function of storing data used for logic operation. The multiplier 73 is a logic circuit dedicated to multiplication. When the PLD 50 has a function of executing multiplication, the multiplier 73 is not necessarily provided.

<Example of Cross-Sectional Structure of Semiconductor Device>

Figure 10:
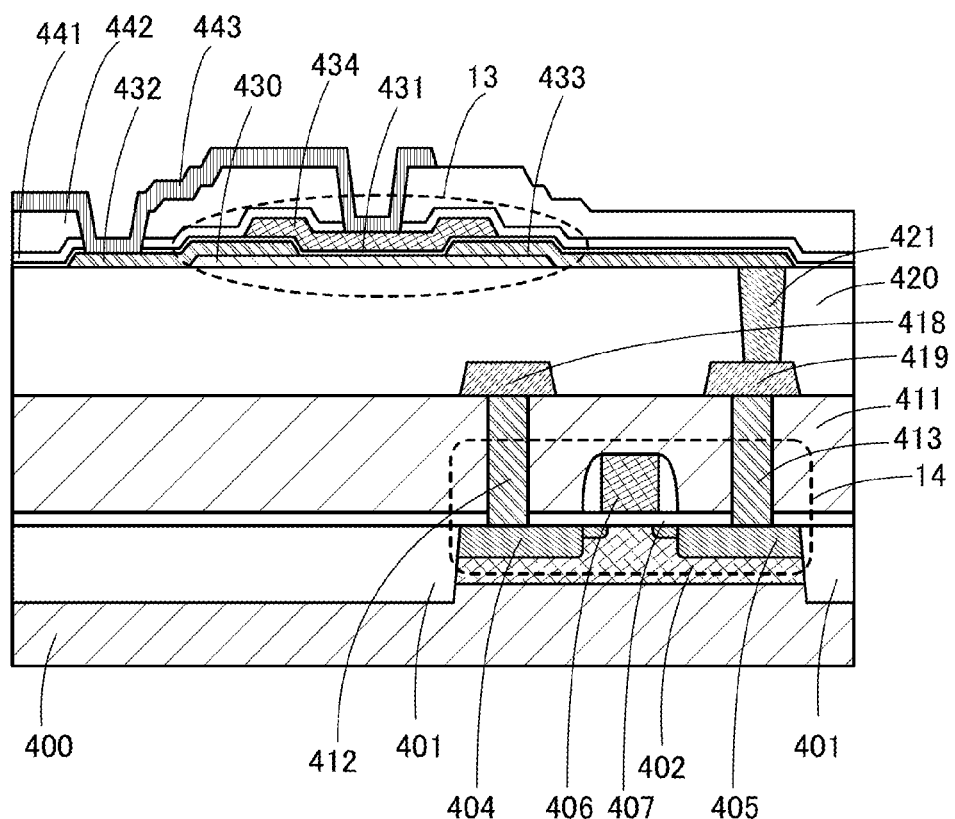
FIG. 10 illustrates a cross-sectional structure of a semiconductor device.

Next, an example of the cross-sectional structure of the transistors 13 and 14 included in the semiconductor device 10 illustrated in FIG. 2 is illustrated in FIG. 10.

FIG. 10 illustrates an example in which the transistor 13 including a channel formation region in an oxide semiconductor film is formed over the transistor 14 including a channel formation region in a single crystal silicon substrate.

The transistor 14 may include a channel formation region in a semiconductor film or a semiconductor substrate of silicon, germanium, or the like in an amorphous, microcrystalline, polycrystalline, or single crystal state. Alternatively, the transistor 14 may include a channel formation region in an oxide semiconductor film or an oxide semiconductor substrate. In the case where channel formation regions of all the transistors are included in an oxide semiconductor film or an oxide semiconductor substrate, the transistor 13 is not necessarily stacked over the transistor 14, and the transistors 13 and 14 may be formed in the same layer.

In the case where the transistor 14 is formed using a thin silicon film, any of the following can be used in the thin film: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

For example, a silicon substrate, a germanium substrate, or a silicon germanium substrate can be used as a semiconductor substrate 400. In FIG. 10, a single crystal silicon substrate is used as the semiconductor substrate 400.

The transistor 14 is electrically isolated by an element isolation method. As the element isolation method, a local oxidation of silicon (LOCOS) method, a shallow trench isolation (STI) method, or the like can be employed. In FIG. 10, an example in which the trench isolation method is used to electrically isolate the transistor 14 is illustrated. Specifically, in the example illustrated in FIG. 10, to electrically isolate the transistor 14, after trenches are formed in the semiconductor substrate 400 by etching or the like, element separation regions 401 are formed by embedding an insulating material such as silicon oxide in the trenches.

In a region where the n-channel transistor 14 is formed between the element separation regions 401, a p-well 402 is provided by selectively adding an impurity element imparting p-type conductivity.

The transistor 14 includes impurity regions 404 and 405 which are formed in the p-well 402 and function as source and drain regions, a gate electrode 406, and a gate insulating film 407 sandwiched between the semiconductor substrate 400 and the gate electrode 406. The gate electrode 406 overlaps with a channel formation region formed between the impurity regions 404 and 405 with the gate insulating film 407 positioned between the gate electrode 406 and the channel formation region.

An insulating film 411 is provided over the transistor 14. Openings are formed in the insulating film 411. In the openings, a conductive film 412 and a conductive film 413 which are electrically connected to the impurity region 404 and the impurity region 405, respectively, are formed.

The conductive film 412 is electrically connected to the conductive film 418 formed over the insulating film 411. The conductive film 413 is electrically connected to the conductive film 419 formed over the insulating film 411.

An insulating film 420 is formed over the conductive films 418 and 419. An opening is formed in the insulating film 420. In this opening, a conductive film 421 electrically connected to the conductive film 419 is formed.

Furthermore, in FIG. 10, the transistor 13 is formed over the insulating film 420.

The transistor 13 includes a semiconductor film 430 containing an oxide semiconductor over the insulating film 420; conductive films 432 and 433 which function as source and drain electrodes and are provided over the semiconductor film 430; a gate insulating film 431 over the semiconductor film 430 and the conductive films 432 and 433; and a conductive film 434 functioning as a gate electrode which is provided over the gate insulating film 431 and overlaps the semiconductor film 430 in the region between the conductive films 432 and 433. Note that the conductive film 433 is electrically connected to the conductive film 421.

An insulating film 441 and an insulating film 442 are formed to be stacked in this order over the transistor 13. Openings are provided in the insulating film 441 and the insulating film 442. A conductive film 443 that is in contact with the conductive films 432 and 434 at the openings is provided over the insulating film 442.

Note that in FIG. 10, the transistor 13 includes the conductive film 434 on at least one side of the semiconductor film 430. The transistor 13 may include a pair of gate electrodes provided with the semiconductor film 430 therebetween.

When the transistor 13 includes a pair of gate electrodes with the semiconductor film 430 positioned therebetween, a signal for controlling an on/off state may be supplied to one of the gate electrodes, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 10, the transistor 13 has a single-gate structure in which one channel formation region corresponding to one conductive film 434 is provided. However, the transistor 13 may have a multi-gate structure in which a plurality of electrically connected gate electrodes is provided so that a plurality of channel formation regions is included in one active layer.

<Semiconductor Film>

A highly purified oxide semiconductor (purified OS) obtained by reduction of impurities such as moisture or hydrogen that serve as electron donors (donors) and reduction of oxygen vacancies is an intrinsic (i-type) semiconductor or a substantially i-type semiconductor. Thus, a transistor including a channel formation region in a highly purified oxide semiconductor film has an extremely low off-state current and high reliability.

Specifically, various experiments can prove a low off-state current of a transistor including a channel formation region in a highly purified oxide semiconductor film. For example, even when an element has a channel width of $1\times10^6$ µm and a channel length of 10 µm, the off-state current can be lower than or equal to the measurement limit of a semiconductor parameter analyzer, i.e., lower than or equal to $1\times10^{-13}$ A, at a voltage (drain voltage) between a source electrode and a drain electrode of 1 V to 10 V. In that case, the off-state current standardized on the channel width of the transistor is lower than or equal to 100 zA/µm. Furthermore, a capacitor and a transistor were connected to each other and the off-state current was measured using a circuit in which electric charge flowing to or from the capacitor is controlled by the transistor. In this measurement, a highly purified oxide semiconductor film was used in the channel formation region of the transistor, and the off-state current of the transistor was measured from a change in the amount of electric charge of the capacitor per unit hour. The result of the measurement shows that, in the case where the voltage between the source electrode and the drain electrode of the transistor is 3 V, a lower off-state current of several tens of yoctoamperes per micrometer is obtained. Accordingly, the transistor including the highly purified oxide semiconductor film in the channel formation region has a much lower off-state current than a crystalline silicon transistor.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Ce—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that an off-state current can be sufficiently reduced. Further, the In—Ga—Zn-based oxide has high mobility.

For example, with an In—Sn—Zn-based oxide, high mobility can be relatively easily obtained. However, even with an In—Ga—Zn-based oxide, mobility can be increased by lowering defect density in a bulk.

The structure of the oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film will be described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to $-10°$ and less than or equal to $10°$, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface, which is used as an axis (φ axis), with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image is a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis of the crystal might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, variation in the electrical characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100° C. to 740° C., preferably 200° C. to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing the power. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of the InO$_X$ powder, the GaO$_Y$ powder, and the ZnO$_Z$ powder is, for example, 2:2:1, 8:4:3, 3:1:1, 1:1:1, 4:2:3, or 3:1:2. The kinds of powder and the molar ratio for mixing powder may be changed as appropriate depending on a target to be formed.

Alkali metal is not an element included in an oxide semiconductor and thus is an impurity. Alkaline earth metal is also an impurity in the case where alkaline earth metal is not included in an oxide semiconductor. Alkali metal, in particular, Na becomes Na$^+$ when an insulating film that is in contact with an oxide semiconductor film is an oxide and Na diffuses into the insulating film. In addition, in the oxide semiconductor film, Na cuts or enters a bond between metal and oxygen that are included in an oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5\times10^{16}/cm^3$ or less, further preferably $1\times10^{16}/cm^3$ or less, still further preferably $1\times10^{15}/cm^3$ or less. Similarly, the measurement value of a Li concentration is preferably $5\times10^{15}/cm^3$ or less, further preferably $1\times10^{15}/cm^3$ or less. Similarly, the measurement value of a K concentration is preferably $5\times10^{15}/cm^3$ or less, further preferably $1\times10^{15}/cm^3$ or less.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electrical characteristics of the transistor are likely to deteriorate as in the case of alkali metal or alkaline earth metal. Thus, the concentrations of silicon and carbon in the oxide semiconductor film are preferably low. Specifically, the measurement value of a C concentration or the measurement value of a Si concentration by secondary ion mass spectrometry is preferably $1\times10^{18}/cm^3$ or less. In that case, the deterioration of the electrical characteristics of the transistor can be prevented, so that the reliability of the semiconductor device can be improved.

Metal in the source electrode and the drain electrode extracts oxygen from the oxide semiconductor film depending on a conductive material used for the source electrode and the drain electrode. In that case, a region in the oxide semiconductor film that is in contact with the source electrode or the drain electrode becomes an n-type region due to generation of oxygen vacancies.

The n-type region serves as a source region or a drain region, resulting in a decrease in the contact resistance between the oxide semiconductor film and the source electrode or the drain electrode. Thus, by forming the n-type region, the mobility and on-state current of the transistor can be increased, so that a switch circuit including the transistor can operate at high speed.

Note that metal in the source electrode and the drain electrode might extract oxygen when the source electrode and the drain electrode are formed by sputtering or the like or might extract oxygen by heat treatment performed after the source electrode and the drain electrode are formed.

Further, the n-type region is easily formed by using a conductive material that is easily bonded to oxygen for the source electrode and the drain electrode. The conductive material can be, for example, Al, Cr, Cu, Ta, Ti, Mo, or W.

The oxide semiconductor film is not limited to a single-layer metal oxide film and may have a stacked structure of a plurality of metal oxide films. In a semiconductor film in which first to third metal oxide films are stacked sequentially, for example, each of the first and third metal oxide films is an oxide film that contains at least one of metal elements contained in the second metal oxide film and whose energy at the bottom of the conduction band is closer to the vacuum level than that of the second metal oxide film by 0.05 eV or more, 0.07 eV or more, 0.1 eV or more, or 0.15 eV or more and 2 eV or less, 1 eV or less, 0.5 eV or less, or 0.4 eV or less. The second metal oxide film preferably contains at least indium because carrier mobility is increased.

In the case where the transistor has the above semiconductor film, when an electric field is applied to the semiconductor film by application of voltage to a gate electrode, a channel region is formed in the second metal oxide film whose energy at the bottom of the conduction band is low in the semiconductor film. In other words, the third metal oxide film is provided between the second metal oxide film and the gate insulating film, so that a channel region can be formed in the second metal oxide film insulated from the gate insulating film.

Since the third metal oxide film contains at least one of the metal elements contained in the second metal oxide film, interface scattering hardly occurs at an interface between the second metal oxide film and the third metal oxide film. Thus, carriers are not easily inhibited from moving at the interface, which results in an increase in the field-effect mobility of the transistor.

When an interface state is formed at an interface between the second metal oxide film and the first metal oxide film, a channel region is also formed in a region close to the interface; thus, the threshold voltage of the transistor varies. However, since the first metal oxide film contains at least one of the metal elements contained in the second metal oxide film, an interface state is hardly formed at the interface between the second metal oxide film and the first metal oxide film. Accordingly, the above structure can reduce variations in the electrical characteristics of the transistor, such as the threshold voltage.

Further, it is preferable that a plurality of oxide semiconductor films be stacked so that an interface level due to impurities existing between the metal oxide films, which inhibits carrier flow, is not formed at the interface between the metal oxide films. This is because if impurities exist between the stacked metal oxide films, the continuity of the lowest conduction band energy between the metal oxide films is lost, and carriers are trapped or disappear by recombination in the vicinity of the interface. By reducing impurities existing between the films, a continuous junction (here, particularly a U-shape well structure whose lowest conduction band energy is changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering system) provided with a load lock chamber. Each chamber of the sputtering system is preferably evacuated to a high vacuum (to about $5\times10^{-7}$ Pa to $1\times10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evacuation in a chamber but also high purity of a sputtering gas is necessary to obtain a high-purity intrinsic oxide semiconductor. As an oxygen gas or an argon gas used as the sputtering gas, a gas that is highly purified to have a dew point of $-40°$ C. or lower, preferably $-80°$ C. or lower, further preferably $-100°$ C. or lower is used, so that entry of moisture or the like into the oxide semiconductor film can be prevented as much as possible. Specifically, in the case where the second metal oxide film is In-M-Zn oxide (M is Ga, Y, Zr, La, Ce, or Nd) and a target having the atomic ratio of metal elements of In:M:Zn=$x_1$:$y_1$:$z_1$ is used for forming the second metal oxide film, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the second metal oxide film. Typical examples of the atomic ratio of the metal elements of the target are In:M:Zn=1:1:1, In:M:Zn=3:1:2, and the like.

Specifically, in the case where the first metal oxide film and the third metal oxide film are each In-M-Zn oxide (M is Ga, Y, Zr, La, Ce, or Nd) and a target having the atomic ratio of metal elements of In:M:Zn=$x_2$:$y_2$:$z_2$ is used for forming the first and third metal oxide films, $x_2/y_2 < x_1/y_1$ is preferably satisfied and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the first and third metal oxide films. Typical examples of the atomic ratio of the metal elements of the target are In:M:Zn=1:3:2, In:M:Zn=1:3:4, In:M:Zn=1:3:6, In:M:Zn=1:3:8, and the like.

The thickness of the first metal oxide film and the third metal oxide film ranges from 3 nm to 100 nm, preferably from 3 nm to 50 nm. The thickness of the second metal oxide film ranges from 3 nm to 200 nm, preferably from 3 nm to 100 nm, further preferably from 3 nm to 50 nm.

In the three-layer semiconductor film, the first to third metal oxide films can be amorphous or crystalline. Note that the transistor can have stable electrical characteristics when the second metal oxide film where a channel region is formed is crystalline; therefore, the second metal oxide film is preferably crystalline.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by sputtering is used as the first and third metal oxide films, a sputtering target that is an In—Ga—Zn-based oxide containing In, Ga, and Zn at an atomic ratio of 1:3:2 can be used to deposit the first and third metal oxide films. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, a sputtering target including a polycrystalline In—Ga—Zn-based oxide containing In, Ga, and Zn at an atomic ratio of 1:1:1 is preferably used to deposit the second metal oxide film. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portions of the semiconductor film in the transistor may be tapered or rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a semiconductor device including the transistor. Further, when the semiconductor film including the stacked metal oxide films is used in the transistor, the n-type region particularly preferably reaches the second metal oxide film part of which is to be a channel region, in which case the mobility and on-state current of the transistor are further increased and higher-speed operation of the semiconductor device is achieved.

<Examples of Electronic Device>

A PLD or a semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Further, as electronic devices that can include the PLD or semiconductor device of one embodiment of the present invention, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 11A to 11F illustrate specific examples of these electronic devices.

FIG. 11A illustrates a portable game machine, which includes a housing 5001, a housing 5002, a display portion 5003, a display portion 5004, a microphone 5005, speakers 5006, an operation key 5007, a stylus 5008, and the like. Note that although the portable game machine in FIG. 11A has the two display portions 5003 and 5004, the number of display portions included in the portable game machine is not limited thereto.

FIG. 11B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

FIG. 11C illustrates a laptop, which includes a housing 5401, a display portion 5402, a keyboard 5403, a pointing device 5404, and the like.

FIG. 11D illustrates an electric refrigerator-freezer, which includes a housing 5301, a refrigerator door 5302, a freezer door 5303, and the like.

FIG. 11E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

FIG. 11F illustrates an ordinary motor vehicle, which includes a car body 5101, wheels 5102, a dashboard 5103, lights 5104, and the like.

This application is based on Japanese Patent Application serial no. 2013-105008 filed with Japan Patent Office on May 17, 2013, the entire contents of which are hereby incorporated by reference.

What is claimed is:

1. A semiconductor device comprising:
a first transistor having a gate, a source, and a drain;
a second transistor having a gate, a source, and a drain, wherein the gate of the second transistor and one of the source and the drain of the second transistor are electrically connected to a first node, and another one of the source and the drain of the second transistor is electrically connected to a second node, and wherein the second node is electrically connected to the gate of the first transistor;
a first switch electrically connected to the first node, wherein the first switch has a first terminal electrically connected to the first node and a second terminal electrically connected to a first wiring;
a second switch electrically connected to the second node, wherein the second switch has a first terminal electrically connected to the second node and a second terminal electrically connected to the first wiring; and
a capacitor electrically connected to the first node.

2. The semiconductor device according to claim 1, wherein the first switch and the second switch are a third transistor and a fourth transistor, respectively, and
wherein each of the second transistor, the third transistor, and the fourth transistor includes a channel formation region in an oxide semiconductor film.

3. The semiconductor device according to claim 2, wherein the oxide semiconductor film comprises In, Ga, and Zn.

4. The semiconductor device according to claim 1, wherein the semiconductor device includes a programmable logic device.

5. A programmable logic device comprising:
a first transistor having a gate, a source, and a drain, wherein one of the source and the drain of the first transistor is electrically connected to a first circuit, and another one of the source and the drain of the first transistor is electrically connected to a second circuit;
a second transistor having a gate, a source, and a drain, wherein the gate of the second transistor and one of the source and the drain of the second transistor are electrically connected to a first node, and another one of the source and the drain of the second transistor is electrically connected to a second node, and wherein the second node is electrically connected to the gate of the first transistor;
a first switch having a first terminal electrically connected to the first node and a second terminal electrically connected to a first wiring;
a second switch having a first terminal electrically connected to the second node and a second terminal electrically connected to the first wiring; and
a capacitor having a first electrode electrically connected to the first node.

6. The programmable logic device according to claim 5, wherein the first switch is a third transistor having a gate, a source, and a drain,
wherein one of the source and the drain of the third transistor is electrically connected to the first node, another one of the source and the drain of the third transistor is electrically connected to the first wiring, and the gate of the third transistor is electrically connected to a second wiring,
wherein the second switch is a fourth transistor having a gate, a source, and a drain, and
wherein one of the source and the drain of the fourth transistor is electrically connected to the gate of the first transistor through the second node, another one of the source and the drain of the fourth transistor is electrically connected to the first wiring, and the gate of the fourth transistor is electrically connected to the second wiring.

7. The programmable logic device according to claim 5, wherein the first switch and the second switch are a third transistor and a fourth transistor, respectively, and
wherein each of the second transistor, the third transistor, and the fourth transistor includes a channel formation region in an oxide semiconductor film.

8. The programmable logic device according to claim 7, wherein the oxide semiconductor film comprises In, Ga, and Zn.

9. A programmable logic device comprising:
a first transistor having a gate, a source, and a drain, one of the source and the drain of the first transistor electrically connected to a first circuit, and another one of the source and the drain of the first transistor electrically connected to a second circuit, wherein the first transistor is configured to control electrical connection between the first circuit and the second circuit in accordance with a potential of the gate of the first transistor;
a second transistor having a gate, a source, and a drain, the gate and one of the source and the drain of the second transistor electrically connected to a first node, and another one of the source and the drain of the second transistor electrically connected to a second node;
a first switch configured to control supply of a signal to the first node;
a second switch configured to control supply of the signal to the second node; and
a capacitor configured to hold a potential of the signal supplied to the first node.

10. The programmable logic device according to claim 9, wherein the first switch is a third transistor having a gate, a source, and a drain,
wherein one of the source and the drain of the third transistor is electrically connected to the first node, another one of the source and the drain of the third transistor is electrically connected to a first wiring, and the gate of the third transistor is electrically connected to a second wiring,
wherein the second switch is a fourth transistor having a gate, a source, and a drain, and
wherein one of the source and the drain of the fourth transistor is electrically connected to the gate of the first transistor through the second node, another one of the source and the drain of the fourth transistor is electrically connected to the first wiring, and the gate of the fourth transistor is electrically connected to the second wiring.

11. The programmable logic device according to claim 9, wherein the first switch and the second switch are a third transistor and a fourth transistor, respectively, and
wherein each of the second transistor, the third transistor, and the fourth transistor includes a channel formation region in an oxide semiconductor film.

12. The programmable logic device according to claim 11, wherein the oxide semiconductor film comprises In, Ga, and Zn.

* * * * *